(12) United States Patent  
Sofue et al.

(10) Patent No.: US 7,745,818 B2
(45) Date of Patent: Jun. 29, 2010

(54) LIGHT EMITTING DEVICE WITH SILICONE RESIN LAYER FORMED BY SCREEN PRINTING

(75) Inventors: Shinsuke Sofue, Anan (JP); Hiroto Tamaki, Anan (JP); Kunihiro Izuno, Anan (JP)

(73) Assignee: Nichia Corporation, Anan-Shi, Tokushima-Ken (JP)

( * ) Notice: Subject to any disclaimer, the term of this patent is extended or adjusted under 35 U.S.C. 154(b) by 298 days.

(21) Appl. No.: 11/399,501

(22) Filed: Apr. 7, 2006

(65) Prior Publication Data

US 2006/0226758 A1    Oct. 12, 2006

(30) Foreign Application Priority Data

Apr. 8, 2005    (JP) .............................. 2005-112804

(51) Int. Cl.
 *H01L 35/24*    (2006.01)
 *H01L 51/00*    (2006.01)

(52) U.S. Cl. .......................... 257/40; 257/99; 257/100; 257/E33.059

(58) Field of Classification Search .................. 257/40, 257/99, 100, E33.059
 See application file for complete search history.

(56) References Cited

U.S. PATENT DOCUMENTS 5,561,203 A * 10/1996 Strong et al. ................ 525/477

| 2003/0071366 A1* | 4/2003 | Rubinsztajn et al. ........ 257/791 |
| 2003/0166795 A1* | 9/2003 | Hasegawa et al. ........... 525/479 |
| 2004/0116640 A1* | 6/2004 | Miyoshi ....................... 528/12 |
| 2004/0234813 A1* | 11/2004 | Lee et al. ..................... 428/690 |
| 2005/0006794 A1* | 1/2005 | Kashiwagi et al. ........... 257/788 |
| 2006/0035092 A1* | 2/2006 | Shimizu et al. .............. 428/447 |
| 2006/0081864 A1* | 4/2006 | Nakazawa .................... 257/98 |
| 2006/0170332 A1* | 8/2006 | Tamaki et al. ................ 313/498 |
| 2006/0226774 A1* | 10/2006 | Sofue et al. .................. 313/512 |
| 2006/0229408 A1 | 10/2006 | Shimizu et al. |
| 2006/0270786 A1* | 11/2006 | Shimizu et al. .............. 524/588 |

FOREIGN PATENT DOCUMENTS

WO    WO 2004107458 A2 *    12/2004

\* cited by examiner

*Primary Examiner*—Eugene Lee
*Assistant Examiner*—Anthony Ho
(74) *Attorney, Agent, or Firm*—Westerman, Hattori, Daniels & Adrian, LLP

(57) ABSTRACT

A light emitting device, including a light emitting element, and a resin layer that has been screen printed to coat said light emitting element is provided. The resin layer is formed from a curable silicone resin composition, which includes (i) an organopolysiloxane with a polystyrene equivalent weight average molecular weight of at least $5 \times 10^3$, (ii) a condensation catalyst, (iii) a solvent, and (iv) a finely powdered inorganic filler. The uniformity of the film thickness is excellent, thus resulting in little color irregularities during light emission from the light emitting element.

7 Claims, 4 Drawing Sheets

LIGHT EMITTING DEVICE WITH SILICONE RESIN LAYER FORMED BY SCREEN PRINTING

BACKGROUND OF THE INVENTION

1. Field of the Invention

The present invention relates to a light emitting device that can be used in a liquid crystal backlight, an illumination light source, and various types of indicators, displays and traffic signal lights, and relates particularly to a light emitting device in which the light emitting element is coated with a silicone resin.

2. Description of the Prior Art

In light emitting devices that use a light emitting element such as an LED, the light emitting element is typically coated with a phosphor-containing layer, or a transparent resin layer that functions as a lens or the like. Conventionally, epoxy resins have been used as the material for these coating layers, but recently, silicone resins have begun to attract attention, as a result of their superior levels of heat resistance.

However, with short wavelength LEDs such as blue LEDs and ultraviolet LEDs now being developed, the resin layer now requires a tougher material that is not only capable of withstanding heat generation, but is also able to withstand this type of high energy, short wavelength light. Previously proposed silicone resins have been addition curable resins that use a hydrosilylation reaction, meaning the proportion of silethylene linkages within the cured product is high. Because silethylene linkages are prone to cleavage by light or heat, the main skeleton within the cured product is prone to deterioration, and the resin is prone to bleed-out of low molecular weight, fluid, oily silicone. As a result, the mechanical strength of the cured product falls, and the resin is more likely to become brittle and prone to heat deformation. Furthermore, the low molecular weight silicone components that bleed out can cause a variety of faults. In addition, if the resin reaches this state, then color irregularities and tone variation are more likely to occur during light emission, meaning the color tone characteristics of the light emitting element may be affected.

Conventionally, application of a sealing resin to a light emitting element has been conducted using a method in which the resin is dripped onto the light emitting element. However, the uniformity of the film thickness of a resin layer formed using this method is poor, which can cause color irregularities during light emission. In order to overcome the drawbacks associated with this type of dripping method, screen printing methods are now starting to be used. In a screen printing method, the resin used should exhibit ready separation from the metal mask during printing, and superior adhesion to the light emitting element following curing, but a resin material that adequately satisfies these requirements is, as yet, still unknown.

SUMMARY OF THE INVENTION

Accordingly, an object of the present invention is to provide a light emitting device, in which the light emitting element exhibits excellent levels of heat resistance, light resistance to high energy light such as ultraviolet light, and mechanical strength, and has been coated with a silicone resin layer that is suited to formation using a screen printing method.

In order to achieve the above object, the present invention provides a light emitting device, comprising a light emitting element, and a resin layer that has been screen printed so as to coat the light emitting element, wherein the resin layer comprises a cured product of a curable silicone resin composition comprising:

(i) an organopolysiloxane with a polystyrene equivalent weight average molecular weight of at least $5 \times 10^3$, represented by an average composition formula (1) shown below:

$$R^1_a(OX)_b SiO_{(4-a-b)/2} \qquad (1)$$

wherein, each $R^1$ represents, independently, an alkyl group, alkenyl group or aryl group of 1 to 6 carbon atoms, each X represents, independently, a hydrogen atom, or an alkyl group, alkenyl group, alkoxyalkyl group or acyl group of 1 to 6 carbon atoms, a represents a number within a range from 1.05 to 1.5, b represents a number that satisfies $0<b<2$, and the value of a+b satisfies $1.05<a+b<2$, (ii) a condensation catalyst, (iii) a solvent, and (iv) a finely powdered inorganic filler.

The present invention also provides a method of manufacturing a light emitting device, comprising the steps of applying the above curable silicone resin composition to a light emitting element using screen printing, and curing the obtained composition layer so as to coat the light emitting element with a cured resin layer.

The silicone resin composition used in coating the light emitting element of a light emitting device of the present invention contains no silethylene linkages within the cured product, and consequently exhibits excellent levels of heat resistance and light resistance, as well as superior mechanical strength, excellent optical transparency, and a small birefringence.

Furthermore, because the resin layer is formed by screen printing, the uniformity of the film thickness is excellent, meaning color irregularities during light emission from the light emitting element are unlikely. Additional benefits include the fact that the resin composition used is easily separated from the mask such as a metal mask used during screen printing, and the fact that following curing, the composition exhibits excellent adhesion to the light emitting element, and a high level of durability.

Accordingly, a light emitting device of the present invention is able to exhibit stable optical characteristics and a high level of reliability over an extended period.

DETAILED DESCRIPTION OF THE PREFERRED EMBODIMENTS

Figure 1:
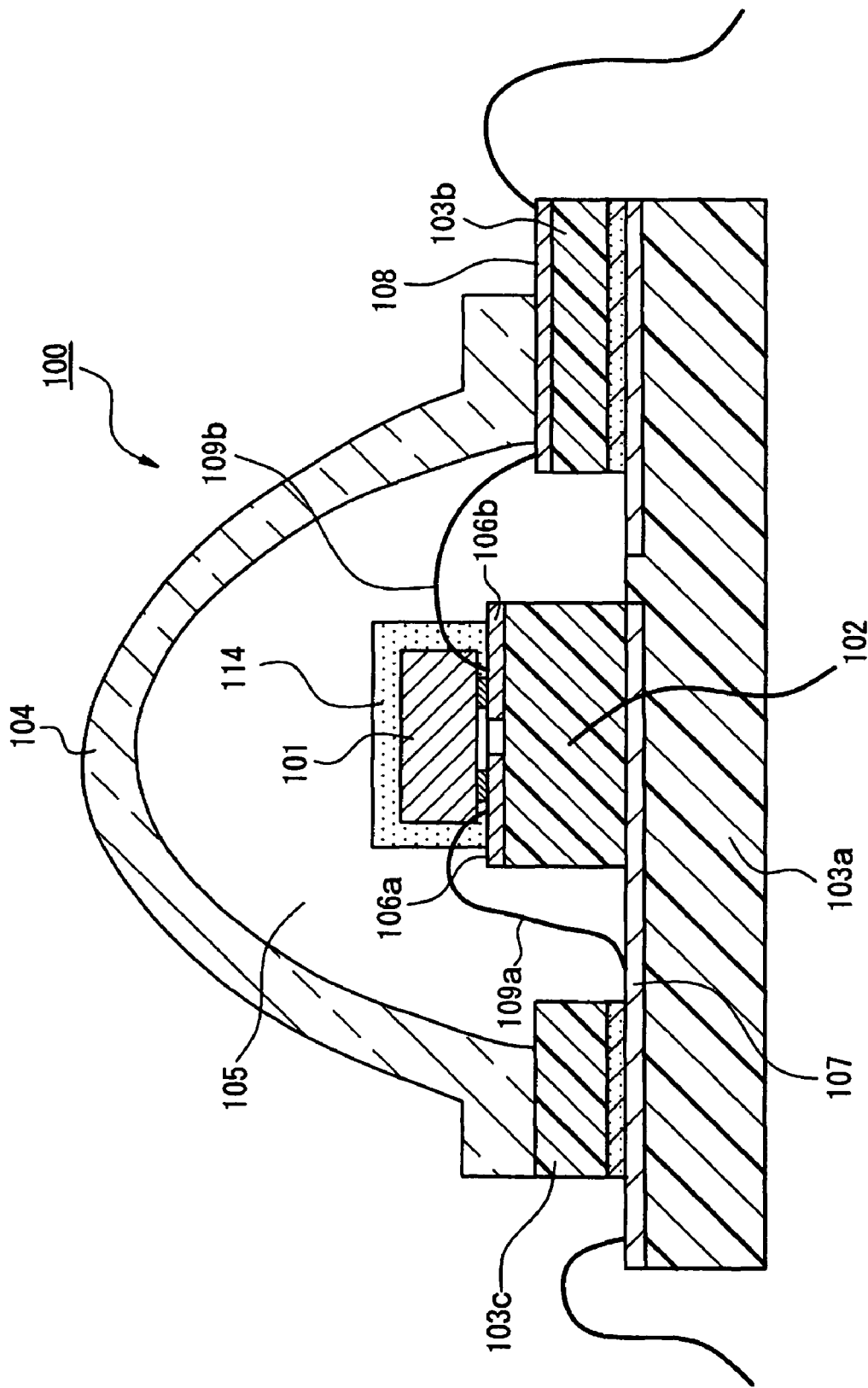
FIG. 1 is an end view of a longitudinal cross-section showing an embodiment of a light emitting device of the present invention.

As follows is a description of the elements and materials and the like used in a light emitting device of the present invention.

[Curable Silicone Resin]

In a light emitting device of the present invention, the resin layer can be provided as a phosphor-containing layer, a lens, or a light emitting element protective layer or the like. The resin layer comprises a cured product of a curable silicone resin comprising the components (i) through (iv) described above. As follows is a detailed description of each of the components of this composition. In the following description, unless stated otherwise, room temperature refers to a temperature of 24±2° C.

<Organopolysiloxane (i)>

The organopolysiloxane of the component (i) is represented by the average composition formula (1) shown above, and has a polystyrene equivalent weight average molecular weight of at least $5 \times 10^3$.

In the above average composition formula (1), examples of suitable alkyl groups represented by $R^1$ include a methyl group, ethyl group, propyl group, or butyl group. An example of suitable alkenyl groups include a vinyl group or allyl group. An example of a suitable aryl group is a phenyl group. Of these, a methyl group is preferred as the $R^1$ group, as the resulting cured product exhibits superior levels of heat resistance and ultraviolet light resistance and the like.

Examples of suitable alkyl groups represented by X include a methyl group, ethyl group, propyl group, isopropyl group, butyl group, or isobutyl group. An example of a suitable alkenyl group is a vinyl group. Examples of suitable alkoxyalkyl groups include a methoxyethyl group, ethoxyethyl group, or butoxyethyl group. Examples of suitable acyl groups include an acetyl group or propionyl group. Of these, a hydrogen atom, methyl group or isobutyl group is preferred as the X group.

a is preferably a number within a range from 1.15 to 1.25, and b is preferably a number that satisfies 0.01≦b<1.4, and even more preferably 0.01≦b≦1.0, and most preferably 0.05≦b≦0.3. If the value of a is less than 1.05, then cracks are more likely to form in the cured product, whereas if the value exceeds 1.5, the cured product loses toughness, is prone to becoming brittle, and may suffer a deterioration in heat resistance and ultraviolet light resistance. If b is zero, then the adhesiveness relative to substrates deteriorates, whereas if b is 2 or greater, a cured product may be unobtainable. Furthermore, a+b is preferably a number that satisfies 1.06≦a+b≦1.8, and even more preferably 1.1≦a+b≦1.7.

Furthermore, in order to ensure a more superior level of heat resistance for the cured product, the (mass referenced) proportion of $R^1$ groups, typified by methyl groups, within the organopolysiloxane of this component is typically no more than 32% by mass, and preferably within a range from 15 to 32% by mass, even more preferably from 20 to 32% by mass, and most preferably from 25 to 31% by mass. If this proportion of $R^1$ groups is too low, then the coating moldability or coating crack resistance may deteriorate.

The organopolysiloxane of this component can be produced either by hydrolysis and condensation of a silane compound represented by a general formula (2) shown below:

$$SiR^1_c(OR^2)_{4-c} \qquad (2)$$

wherein, each $R^1$ represents, independently, a group as defined above, each $R^2$ represents, independently, a group as defined above for X but excluding a hydrogen atom, and c represents an integer of 1 to 3, or by cohydrolysis and condensation of a silane compound represented by the general formula (2), and an alkyl silicate represented by a general formula (3) shown below:

$$Si(OR^2)_4 \qquad (3)$$

wherein, each $R^2$ represents, independently, a group as defined above, and/or a condensation polymerization product of the alkyl silicate (an alkyl polysilicate) (hereafter referred to jointly as an alkyl (poly)silicate).

Both the silane compound and the alkyl (poly)silicate may be used either alone, or in combinations of two or more different materials.

Examples of the silane compound represented by the above general formula (2) include methyltrimethoxysilane, methyltriethoxysilane, ethyltrimethoxysilane, ethyltriethoxysilane, phenyltrimethoxysilane, phenyltriethoxysilane, dimethyldimethoxysilane, dimethyldiethoxysilane, diphenyldimethoxysilane, diphenyldiethoxysilane, methylphenyldimethoxysilane and methylphenyldiethoxysilane, and of these, methyltrimethoxysilane and dimethyldimethoxysilane are preferred. These silane compounds may be used either alone, or in combinations of two or more different compounds.

Examples of the alkyl silicate represented by the above general formula (3) include tetraalkoxysilanes such as tetramethoxysilane, tetraethoxysilane and tetraisopropyloxysilane, and examples of the condensation polymerization product of the alkyl silicate (the alkyl polysilicate) include methyl polysilicate and ethyl polysilicate. These alkyl (poly)silicates may be used either alone, or in combinations of two or more different materials.

Of these possibilities, the organopolysiloxane of this component is preferably formed from 50 to 95 mol % of an alkyltrialkoxysilane such as methyltrimethoxysilane, and 50 to 5 mol % of a dialkyldialkoxysilane such as dimethyldimethoxysilane, as such a composition ensures superior levels of crack resistance and heat resistance in the resulting cured product, and organopolysiloxanes formed from 75 to 85 mol % of an alkyltrialkoxysilane such as methyltrimethoxysilane, and 25 to 15 mol % of a dialkyldialkoxysilane such as dimethyldimethoxysilane are even more desirable.

In a preferred embodiment of the present invention, the organopolysiloxane of this component can be obtained either by hydrolysis and condensation of the silane compound described above, or by cohydrolysis and condensation of the silane compound and an alkyl (poly)silicate, and although there are no particular restrictions on the method used for the reaction, the conditions described below represent one example of a suitable method.

The above silane compound and alkyl (poly)silicate are preferably dissolved in an organic solvent such as an alcohol, ketone, ester, cellosolve, or aromatic compound prior to use. Specific examples of preferred solvents include alcohols such as methanol, ethanol, isopropyl alcohol, isobutyl alcohol, n-butanol and 2-butanol, and of these, isobutyl alcohol is particularly preferred as it produces superior levels of curability for the resulting composition, and excellent toughness of the cured product.

In addition, the above silane compound and alkyl (poly) silicate are preferably subjected to hydrolysis and condensation in the presence of an acid catalyst such as acetic acid, hydrochloric acid, or sulfuric acid. The quantity of water added during the hydrolysis and condensation is typically within a range from 0.9 to 1.5 mols, and preferably from 1.0 to 1.2 mols, relative to each mol of the combined quantity of alkoxy groups within the silane compound and the alkyl (poly)silicate. If this blend quantity falls within the range from 0.9 to 1.5 mols, then the resulting composition exhibits excellent workability, and the cured product exhibits excellent toughness.

The polystyrene equivalent weight average molecular weight of the organopolysiloxane of this component is preferably set, using aging, to a molecular weight just below the level that results in gelling, and from the viewpoints of ease of handling and pot life, must be at least $5 \times 10^3$, and is preferably within a range from $5 \times 10^3$ to $3 \times 10^6$, and even more preferably from $1 \times 10^4$ to $1 \times 10^5$. If this molecular weight is less than $5 \times 10^3$, then the composition is prone to cracking on curing. If the molecular weight is too large, then the composition becomes prone to gelling, and the workability deteriorates.

The temperature for conducting the aging described above is preferably within a range from 0 to 40° C., and is even more preferably room temperature. If the aging temperature is from 0 to 40° C., then the organopolysiloxane of this component develops a ladder-type structure, which provides the resulting cured product with excellent crack resistance.

The organopolysiloxane of the component (i) may use either a single compound, or a combination of two or more different compounds.

<Condensation Catalyst (ii)>

The condensation catalyst of the component (ii) is necessary to enable curing of the organopolysiloxane of the component (i). There are no particular restrictions on the condensation catalyst, although in terms of achieving favorable stability for the organopolysiloxane and excellent levels of hardness and ultraviolet light resistance for the resulting cured product, an organometallic catalyst is normally used. Examples of this organometallic catalyst include compounds that contain zinc, aluminum, titanium, tin, or cobalt atoms, and compounds that contain zinc, aluminum, or titanium atoms are preferred. Specific examples of suitable compounds include organic acid zinc compounds, Lewis acid catalysts, organoaluminum compounds, and organotitanium compounds, and more specific examples include zinc octylate (i.e., zinc octoate), zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxy-bis(ethylacetoacetate), tetrabutyl titanate, tetraisopropyl titanate, tin octylate, cobalt naphthenate, and tin naphthenate, and of these, zinc octylate is preferred.

The blend quantity of the component (ii) is typically within a range from 0.05 to 10 parts by mass per 100 parts by mass of the component (i), although in terms of obtaining a composition with superior levels of curability and stability, a quantity within a range from 0.1 to 5 parts by mass is preferred. The condensation catalyst of the component (ii) may use either a single compound, or a combination of two or more different compounds.

<Solvent (iii)>

The solvent of the component (iii) is particularly necessary when screen printing the composition, in order to ensure a favorable level of moldability for the cured product. There are no particular restrictions on this solvent, although the boiling point of the solvent is preferably at least 64° C., even more preferably within a range from 70 to 230° C., and most preferably from 80 to 200° C. If the boiling point falls within this range, then during screen printing, voids generated by the presence of foam do not occur within the composition or the cured product, and the whitening phenomenon observed at the composition surface is also prevented, enabling a favorable molded product to be obtained.

Examples of the solvent of this composition include hydrocarbon-based solvents such as benzene, toluene, and xylene; ether-based solvents such as tetrahydrofuran, 1,4-dioxane, and diethyl ether; ketone-based solvents such as methyl ethyl ketone; halogen-based solvents such as chloroform, methylene chloride, and 1,2-dichloroethane; alcohol-based solvents such as methanol, ethanol, isopropyl alcohol, and isobutyl alcohol; as well as organic solvents with boiling points of less than 150° C. such as octamethylcyclotetrasiloxane and hexamethyldisiloxane, and organic solvents with boiling points of 150° C. or higher such as cellosolve acetate, cyclohexanone, butyl cellosolve, methylcarbitol, carbitol, butylcarbitol, diethylcarbitol, cyclohexanol, diglyme, and triglyme, and of these, xylene, isobutyl alcohol, diglyme, and triglyme are preferred.

These organic solvents may be used either alone, or in combinations of two or more different solvents, although the use of a combination of two or more solvents is preferred as it produces superior leveling characteristics for the applied surface of the composition. In addition, a solvent that comprises at least one organic solvent with a boiling point of 150° C. or higher is particularly preferred as it results in more favorable curing of the composition during screen printing of the composition, and yields a cured product with excellent workability. The proportion of this organic solvent with a boiling point of 150° C. or higher within this component is preferably within a range from 5 to 30% by mass, even more preferably from 7 to 20% by mass, and most preferably from 8 to 15% by mass.

There are no particular restrictions on the blend quantity of this component (iii), although the quantity is preferably no more than 233 parts by mass, even more preferably within a range from 10 to 100 parts by mass, and most preferably from 20 to 80 parts by mass, per 100 parts by mass of the component (i). In other words, the quantity of the component (i) relative to the combined quantity of the component (i) and the component (iii) is preferably at least 30% by mass, even more preferably within a range from 50 to 91% by mass, and most preferably from 55 to 83% by mass. A quantity that satisfies this range improves the moldability of the cured product, and simplifies the processing required to produce a typical thickness for the cured product, in a dried state, within a range from 10 μm to 3 mm, and even more typically from 100 μm to 3 mm.

<Finely Powdered Inorganic Filler (iv)>

The finely powdered inorganic filler of the component (iv) imparts, to the composition, the thixotropic properties that are required during screen printing. In addition, the blending of this inorganic filler also provides other effects, such as ensuring that the light scattering properties of the cured product (such as a low birefringence) and the flowability of the composition fall within appropriate ranges, and strengthening materials that use the composition.

Although there are no particular restrictions on the specific surface area of the finely powdered inorganic filler as determined by a BET method (the BET specific surface area), in those cases where the composition is used for screen printing, this value is preferably at least 100 m²/g (typically within a range from 100 to 400 m²/g), even more preferably 180 m²/g or greater, and most preferably within a range from 200 to 350 m²/g. If the BET specific surface area falls within this range, then thixotropic properties that enable favorable moldability retention are obtained, meaning the blend quantity of this component can be reduced.

There are no particular restrictions on the inorganic filler used to form the finely powdered inorganic filler, and suitable examples include silica, alumina, aluminum hydroxide, titanium oxide, iron oxide, calcium carbonate, magnesium carbonate, aluminum nitride, magnesium oxide, zirconium oxide, boron nitride, and silicon nitride, although generally, silica offers the most suitable particle size and purity, and is consequently preferred.

This silica, namely a finely powdered silica, can use conventional materials, and either wet silica or dry silica is suitable. Specific examples of suitable silica materials include precipitated silica, silica xerogel, fumed silica, fused silica, crystalline silica, or silica in which the surface has been subjected to hydrophobic treatment with organosilyl groups. Examples of suitable commercially available products, listed in terms of their product names, include Aerosil (manufactured by Nippon Aerosil Co., Ltd.), Nipsil (manufactured by Nippon Silica Industry Co., Ltd.), Cabosil (manufactured by Cabot Corporation, U.S.A.), and Santocel (manufactured by Monsanto Company Ltd.).

There are no particular restrictions on the blend quantity of this component (iv), although the quantity is preferably within a range from 5 to 40 parts by mass, even more preferably from 15 to 25 parts by mass, and most preferably from 18 to 20 parts by mass, per 100 parts by mass of the aforementioned component (i). If the blend quantity satisfies this range, then not only is the workability of the resulting composition favorable, but the thixotropic properties required for screen printing are also satisfactory.

The finely powdered inorganic filler of the component (iv) may be used either alone, or in combinations of two or more different materials.

<Other Components>

In addition to the aforementioned components (i) through (iv), other optional components can also be added to the composition, provided such addition does not impair the actions or effects of the present invention. These other components may be used either alone, or in combinations of two or more different materials.

-Phosphor-

Phosphors are a typical optional component which may be added to the composition as necessary.

Examples of suitable phosphors include the types of materials that are widely used in LEDs, such as yttrium aluminum garnet (YAG) phosphors, ZnS phosphors, $Y_2O_2S$ phosphors, red light emitting phosphors, blue light emitting phosphors, and green light emitting phosphors. A more detailed description of the most typical phosphors is given below.

First is a description of phosphors based on an yttrium aluminum oxide phosphor activated with cerium which is excited by light emitted from the light emitting element. Specific examples of these yttrium aluminum oxide phosphors include $YAlO_3$:Ce, $Y_3Al_5O_{12}$:Ce (YAG:Ce), $Y_4Al_2O_9$:Ce, and mixtures thereof. The yttrium aluminum oxide phosphor may also include one or more of Ba, Sr, Mg, Ca, and Zn. Furthermore, by incorporating Si within the phosphor, the crystal growth reaction can be suppressed, enabling better uniformity of the phosphor particles.

In this description, the term Ce-activated yttrium aluminum oxide phosphor is used in a broad sense, and includes phosphors with a fluorescent effect in which a portion of, or all of, the yttrium has been substituted with one or more elements selected from the group consisting of Lu, Sc, La, Gd, and Sm, or in which a portion of, or all of, the aluminum has been substituted with one or more elements selected from of Ba, Tl, Ga, and In, or in which the both yttrium and aluminum have been substituted as above.

More specific examples include photoluminescent phosphors represented by the general formula $(Y_zGd_{1-z})_3Al_5O_{12}$:Ce (wherein, $0<z\leq 1$) or the general formula $(Re_{1-a}Sm_a)_3Re'_5O_{12}$:Ce (wherein, $0\leq a<1$, $0\leq b\leq 1$, Re represents one or more elements selected from the group consisting of Y, Gd, La and Sc, and Re' represents one or more elements selected from the group consisting of Al, Ga, and In).

These phosphors have a garnet structure, and are consequently strongly resistant to heat, light, and moisture, and the peak wavelength of the excitation spectrum can be set in the vicinity of 450 nm. Furthermore, the emission peak occurs in the vicinity of 580 nm, and the emission spectrum is broad, with the spectrum tail extending as far as 700 nm.

Furthermore, by incorporating Gd (gadolinium) into the crystal structure of a photoluminescent phosphor, the excited light emission efficiency in the longer wavelength region of 460 nm or higher can be increased. By increasing the Gd content, the emission peak wavelength shifts to a longer wavelength, and the overall light emission spectrum also shifts to a longer wavelength. In other words, in those cases where a strongly red colored light is required, this can be achieved by increasing the quantity of Gd substitution. On the other hand, as the quantity of Gd increases, the emission luminance of blue colored photoluminescence tends to decrease. In addition, if required, other elements such as Tb, Cu, Ag, Au, Fe, Cr, Nd, Dy, Co, Ni, Ti, and Eu can also be included as well as the Ce.

Moreover, within the composition of an yttrium aluminum garnet phosphor having a garnet structure, by substituting a portion of the Al with Ga, the light emission wavelength can be shifted to a shorter wavelength. Furthermore, by substituting a portion of the Y within the composition with Gd, the light emission wavelength can be shifted to a longer wavelength.

In those cases where a portion of Y is substituted with Gd, the Gd substitution is preferably less than 10%, and the Ce content (degree of substitution) is preferably set within a range from 0.03 to 1.0. At Gd substitution values of 20% or less, the green component is large and the red component is reduced, but by increasing the Ce content, the red component can be supplemented, meaning the desired color tone can be obtained with no reduction in luminance. By using this type of composition, the temperature characteristics become more favorable, and the reliability of the light emitting diode can be improved. Furthermore, by using a photoluminescent phosphor that has been adjusted so as to increase the red component, a light emitting device can be formed that is capable of emitting intermediate colors such as pink or the like.

These types of photoluminescent phosphors use either oxides or compounds that can be readily converted to oxides at high temperatures as the raw materials for Y, Gd, Al, and Ce, and these compounds are mixed together thoroughly in a stoichiometric ratio to obtain the raw material. Alternatively, a coprecipitated oxide, which is obtained by using oxalic acid to coprecipitate a solution comprising the rare earth elements Y, Gd, and Ce dissolved in a stoichiometric ratio within an acid and then firing the thus formed coprecipitate, can be mixed with aluminum oxide, yielding a raw material mixture. A suitable quantity of a fluoride such as barium fluoride or aluminum fluoride is then mixed into the raw material as a flux, the mixture is placed in a crucible and fired in air at a temperature within a range from 1350° C. to 1450° C. for a period of 2 to 5 hours to form a calcined product, and the calcined product is subsequently ball-milled in water, and then washed, separated, dried and finally passed through a sieve to obtain the final product.

This type of photoluminescent phosphor may also use a mixture of two or more different cerium-activated yttrium aluminum garnet phosphors, or other phosphors.

Furthermore, the particle diameter of the phosphor is preferably within a range from 1 μm to 50 μm, and is even more preferably from 3 μm to 30 μm. Phosphors with a particle diameter of less than 3 μm are comparatively prone to the formation of aggregates, and are also prone to thickening and sedimentation within the liquid resin, which causes a reduction in the light transmission efficiency. By ensuring a particle diameter within the above range, this type of light shielding caused by the phosphor can be suppressed, and the output of the light emitting device can be improved. Furthermore, phosphors with particle diameters in the above range also exhibit high levels of light absorption and conversion efficiency, and offer a broader range of excitation wavelengths. In this manner, by incorporating a large particle diameter phosphor with superior optical characteristics, light within the vicinity of the predominant wavelength of the light emitting element can be favorably converted and emitted.

In this description, the particle diameter refers to the value obtained using a volume-based particle size distribution curve. This volume-based particle size distribution curve is obtained by measuring the particle size distribution by a laser diffraction and scattering method, and more specifically, is obtained by dispersing each substance in an aqueous solution of sodium hexametaphosphate of concentration 0.05%, and then using a laser diffraction particle size distribution analyzer (SALD-2000A) to measure across a particle size range from 0.03 μm to 700 μm under an atmosphere at an air temperature of 25° C. and a humidity of 70%. The central particle diameter value for the phosphor used in the aforementioned composition, which represents the particle diameter value at the point where the integrated value of the volume-based particle size distribution curve reaches 50%, preferably falls within a range from 3 μm to 30 μm. Furthermore, phosphor particles having this central particle diameter value are preferably included in the composition at a high frequency, and this frequency value is preferably within a range from 20% to 50%. In this manner, by using a phosphor with a small variation in the particle diameter, the variation in chromaticity between individual products can be reduced, and light emitting devices with favorable color tone can be produced.

The phosphor is preferably dispersed uniformly throughout the resin layer, but may also be precipitated out within the resin layer.

Furthermore, the present invention is not restricted to the YAG phosphors described above, and a variety of other phosphors can also be used. Examples of suitable other phosphors include $M_2Si_5N_8$:Eu (wherein, M represents an alkaline earth metal such as Ca, Sr, or Ba), $MSi_2O_2N_2$:Eu (wherein, M represents an alkaline earth metal such as Ca, Sr, or Ba), $La_2O_2S$:Eu, $SrAl_2O_4$:R, and $M_5(PO_4)_3X$:R (wherein, M represents one or more elements selected from Sr, Ca, Ba, Mg, and Zn, X represents one or more elements selected from F, Cl, Br, and I, and R represents one or more of Eu, Mn, and a combination of Eu and Mn).

Alkaline earth metal silicates that have been activated with europium can also be included as alternative phosphors. These alkaline earth metal silicates are preferably alkaline earth metal orthosilicates represented by the types of general formulas shown below.

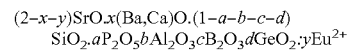

(wherein, 0<x<1.6, 0.005<y<0.5, 0<a,b,c,d<0.5)

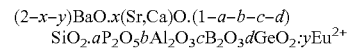

(wherein, 0.01<x<1.6, 0.05<y<0.5, 0<a,b,c,d<0.5)

Here, at least one of a, b, c, and d preferably has a value that exceeds 0.01.

In addition to the alkaline earth metal silicates described above, other phosphors comprising alkaline earth metal salts include europium and/or manganese-activated alkaline earth metal aluminates, Y(V,P,Si)$O_4$:Eu, or alkaline earth metal-magnesium-disilicates represented by the formula below.

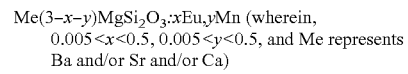

Phosphors comprising the aforementioned alkaline earth metal silicates are produced in the manner described below. Namely, the starting material alkaline earth metal carbonate, silicon dioxide, and europium oxide are mixed together thoroughly in the stoichiometric ratio corresponding with the desired composition for the target alkaline earth metal silicate, and a typical solid-state reaction used in the production of phosphors is conducted under a reducing atmosphere, converting the mixture to the desired phosphor at a temperature of 1100° C. and 1400° C. During the reaction, a quantity of less than 0.2 mols of either ammonium chloride or some other halide is preferably added. Furthermore, if required, a portion of the silicon can be substituted with germanium, boron, aluminum, or phosphorus, and a portion of the europium can be substituted with manganese.

By combining the types of phosphors described above, that is, one or more phosphors selected from europium and/or manganese-activated alkaline earth metal aluminates, Y(V,P,Si)$O_4$:Eu, and $Y_2O_2S$:Eu$^{3+}$, phosphors with the desired color temperature and a high degree of color reproducibility can be obtained.

-Diffusion Agent-

A diffusion agent is an example of an optional component that may also be added to the aforementioned curable silicone resin. Including a diffusion agent enables various effects to be obtained, including a light diffusion effect, a thickening effect, and a stress diffusion effect. Specific examples of favorable diffusion agents include barium titanate, titanium oxide, aluminum oxide, and silicon oxide. By using these diffusion agents, a light emitting device with a favorable directional pattern can be obtained. The diffusion agent preferably has a central particle diameter of at least 1 nm and less than 5 μm. Diffusion agents with a central particle diameter of approximately 400 nm or greater cause favorable scattering of the light emitted from the light emitting element and the phosphor, and are able to suppress the type of color irregularities that become increasingly likely when phosphors with large particle diameters are used. On the other hand, diffusion agents with a central particle diameter of less than approximately 400 nm have a minimal interference effect on the wavelength of the light emitted from the light emitting element, meaning they offer excellent transparency, and can be used to increase the resin viscosity without lowering the luminance. As a result, in those cases where a color conversion member is positioned by potting or the like, the phosphor within the resin composition can be dispersed substantially uniformly inside the syringe, and that state of uniform dispersion can be maintained, meaning production can be conducted with a favorable yield, even if the phosphor has a large particle diameter and exhibits comparatively poor handling characteristics. In this manner, because the effect of the diffusion agent varies depending on the particle diameter range, the diffusion agents are preferably selected or combined in accordance with the method being used.

-Other Optional Components-

Examples of these other optional components include, age resistors, radical inhibitors, ultraviolet absorbers, adhesion improvers, flame retardants, surfactants, storage stability improvers, antiozonants, photostabilizers, thickeners, plasticizers, coupling agents, antioxidants, thermal stabilizers, conductivity imparting agents, antistatic agents, radiation blockers, nucleating agents, phosphorus-based peroxide decomposition agents, lubricants, pigments, metal deactivators, and physical property modifiers.

-Method of Preparing Composition-

Said curable silicone composition can be prepared by mixing together the aforementioned components (i) through (iv), and any optional components that are to be added, using any arbitrary mixing method. In a specific example, the organopolysiloxane of the component (i), the solvent of the component (iii), and the finely powdered inorganic filler of the component (iv) are first mixed together in a three-roll mill, yielding a mixture. Subsequently, this mixture, the condensation catalyst of the component (ii), and any optional components are placed in a mixer, e.g., Thinky Conditioning Mixer (manufactured by Thinky Corporation) and mixed together, thereby yielding the composition. It is desirable to carry out deaeration as appropriate at each step of preparation of the composition.

[Screen Printing Method and Curing Method]

Next is a description of a method of applying an aforementioned composition to the surface of a light-emitting element using a screen printing method. First, the surface of the light-emitting element is covered with a mask containing a predetermined pattern of openings, and the composition is then poured into a squeegee part. Subsequently, by moving the squeegee across the mask, thereby filing the openings within the mask with the composition (the filling step). Subsequently, the mask is removed. In this manner, the surface of the LED element is coated with the composition.

Although dependent on the actual conditions employed during screen printing, such as the squeegee speed, the printing pressure, the clearance (the gap between the mask and the surface being printed during the printing process), the squeegee angle, and the degree of squeezing, the viscosity of the composition at 23° C. is preferably within a range from $1\times10$ Pa·s to $1\times10^5$ Pa·s, and even more preferably from 50 Pa·s to 2,000 Pa·s (measured using a DV-II digital viscometer manufactured by Brookfield Engineering Labs, Inc., U.S.A., rotational speed: 0.3 rpm), and the thixotropic index is preferably within a range from 1.0 to 15.0, and even more preferably from 3.0 to 9.0.

The composition layer formed in this manner is then cured in the manner. Namely, curing is preferably conducted using a step curing process, in which, for example, the composition layer is cured by heating at 60 to 100° C. (for example, for 1 to 2 hours), followed by heating at 120 to 160° C. (for example, for 1 to 2 hours), and then heating at 180 to 220° C. (for example, for 6 to 12 hours). The step curing process with these steps allows the composition to cure satisfactirily, thereby producing a cured product in which bubble formation is suitably suppressed. The cured resin layer obtained has a thickness of typically 10 μm to 3 mm, more typically 100 μm to 3 mm at a dry state, as described above.

The glass transition point (Tg) of the cured product obtained by curing the above composition is usually too high to enable detection with a commercially available measuring device (for example, a thermomechanical tester manufactured by Ulvac-Riko Inc., (product name: TM-7000, measurement range: 25 to 200° C.)), indicating an extremely superior level of heat resistance for the cured product.

[Light Emitting Element]

There are no particular restrictions on the light emitting element in the present invention, which is not restricted to light emitting elements that emit in the red or green regions, but can also use a light emitting element that emits in the blue region. Moreover, the present invention is not restricted to these types of light emitting elements that emit in the visible spectrum, but can also use light emitting elements that emit in the ultraviolet region to the short wavelength side of visible light, such as light emitting elements that emit light in the ultraviolet region in the vicinity of 360 nm. In those cases where a phosphor is used in the light emitting device, a semiconductor light emitting element having a light emitting layer that is able to emit light with a wavelength that is capable of excitation of the phosphor is preferred. Examples of this type of semiconductor light emitting element include various semiconductors such as ZnSe and GaN, although nitride semiconductors ($In_XAl_YGa_{1-X-Y}N$, wherein $0\leq X$, $0\leq Y$, and $X+Y\leq 1$) capable of emitting short wavelengths that can effect efficient excitation of the phosphor are preferred. Furthermore, if desired, boron or phosphorus can also be incorporated within the above nitride semiconductors. Examples of the structure of the semiconductor include a homostructure, heterostructure or double heterostructure containing an MIS junction, PIN junction or pn junction. A variety of light emission wavelengths can be selected depending on the materials used, and the degree of crystal mixing within the semiconductor layer. Furthermore, the semiconductor active layer may also be a single quantum well structure or a multi-quantum well structure, formed as a thin film in which a quantum effect occurs.

In those cases where a nitride semiconductor is used, a material such as sapphire, spinel, SiC, Si, ZnO, or GaN is preferably used as the semiconductor substrate. In order to enable the formation of nitride semiconductors of favorable crystallinity that are able to be mass produced, the use of a sapphire substrate is preferred. A nitride semiconductor can be formed on top of the sapphire substrate using a MOCVD method or the like. A buffer layer, such as a layer of GaN, AlN, or GaAlN is formed on the sapphire substrate, and a nitride semiconductor having a pn junction can then be formed on top of the buffer layer.

Examples of light emitting elements having a pn junction using a nitride semiconductor include a double heterostructure wherein a first contact layer formed with n-type gallium nitride, a first cladding layer formed with n-type aluminum gallium nitride, an active layer formed with indium gallium nitride, a second cladding layer formed with p-type aluminum gallium nitride, and a second contact layer formed with p-type gallium nitride, are laminated sequentially on top of a buffer layer.

Nitride semiconductors exhibit n-type conductivity when not doped with impurities. In order to form an n-type nitride semiconductor having the desired properties, by improving the light emission efficiency or the like, an n-type dopant such as Si, Ge, Se, Te, or C is preferably introduced into the semiconductor. On the other hand, in order to form a p-type nitride semiconductor, a p-type dopant such as Zn, Mg, Be, Ca, Sr, or Ba is used to dope the semiconductor. Because a nitride semiconductor is not easily converted to a p-type semiconductor simply by doping with a p-type dopant, following introduction of the p-type dopant, the doped semiconductor is preferably subjected to a resistance lowering treatment such as heating in a furnace or irradiation with a plasma. Following formation of the electrodes, light emitting elements comprising the nitride semiconductor can be formed by cutting chips from the semiconductor wafer.

In order to enable the emission of white light from a light emitting device, taking due consideration of factors such as the complementary color relationship with the light emission wavelength from the phosphor and deterioration of the translucent resin, the wavelength of the light emitted from the light emitting element is preferably at least 400 nm but no more than 530 nm, and is even more preferably at least 420 nm but no more than 490 nm. In order to enable further improvements in the excitation and light emission efficiency of the light emitting element and the phosphor, wavelengths of at least 450 nm but no more than 475 nm are particularly desirable.

As follows is a more detailed description of a light emitting device of the present invention, based on an embodiment shown in the drawings. In the light emitting device of this embodiment, an LED that functions as the light emitting element is flip-chip mounted to a sub-mount, with the structure then sealed in an airtight manner by a glass lid that also functions as a glass lens, but this is merely one example, and the light emitting device of the present invention is in no way limited to this embodiment. Other possible structure types include devices in which a screen printed light emitting element is further coated with a silicone resin or the like, non-airtight devices in which the light emitting element is covered with a glass lens lid, and devices that use an epoxy resin instead of the glass. Regardless of the type of structure used, the desired effects can be achieved by providing a resin layer generated by coating the light emitting element with an aforementioned curable silicone resin composition and then curing the composition.

EMBODIMENTS

Next is a description of a specific embodiment of a light emitting device of the present invention.

FIG. 1 is a schematic cross-sectional view through a cross section perpendicular to the principal surface (the surface on which the element is mounted) of a support of a light emitting device 100 according to the present embodiment. In order to facilitate the description, the dimensions of each of the structural components and members have been magnified, so that the figure does not necessarily represent actual dimensions or relative sizes.

The light emitting device 100 has a sub-mount 102 to which a light emitting element 101 is flip-chip mounted, a support 103a for supporting the sub-mount 102, and a glass lens 104 which is a transparent member positioned on the principal surface side of the support 103a. The glass lens 104 is a hemispherical shaped lens, which has a convex shape when viewed from above the light emitting device 100 in the direction of the light emitting element 101, and a concave shape for the inner wall surface that faces the light emitting element 101. The light emitting device 100 has a hollow portion 105 enclosed by the inner wall surface of the glass lens 104 and the principal surface of the support 103a, and the light emitting element 101 is sealed in an airtight manner.

Figure 2:
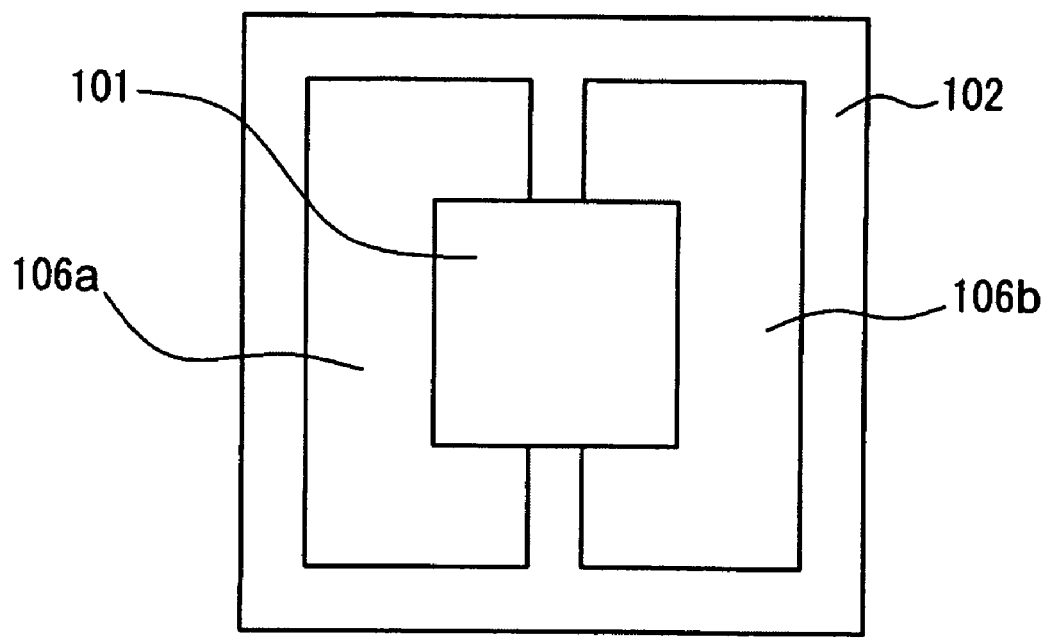
FIG. 2 is a plan view showing a light emitting element that has been flip-chip mounted to a sub-mount.
Figure 3:
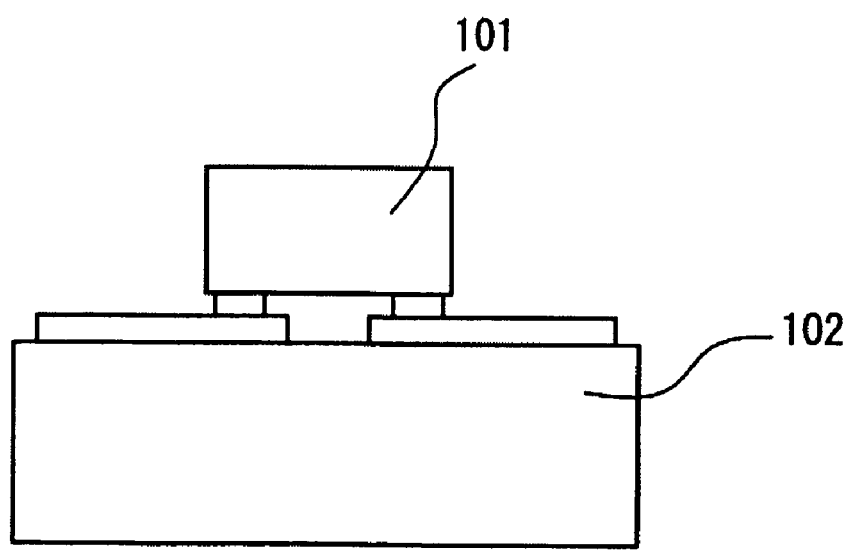
FIG. 3 is a front view of the light emitting element shown in FIG. 2.

FIG. 2 is a plan view showing an enlarged view of only the sub-mount 102, and the light emitting element 101 that is flip-chip mounted thereon, and FIG. 3 is an equivalent front view. The sub-mount 102 comprises an aluminum nitride plate of thickness 1 mm, on which electrodes 106a and 106b have been formed by sputtering using Au as the sputtering material. The material for the sub-mount could also use other materials such as aluminum nitride with a metal pattern formed thereon, or a metal material such as Cu that has been patterned with an insulating layer of alumina or the like. The light emitting element 101 has a positive and negative electrode pair on the surface that faces the sub-mount 102, and these electrodes are welded, via gold bumps, to the electrodes 106a and 106b on the sub-mount 102 by application of load, ultrasound, and heat, thereby forming electrical and mechanical connections.

Figure 4:
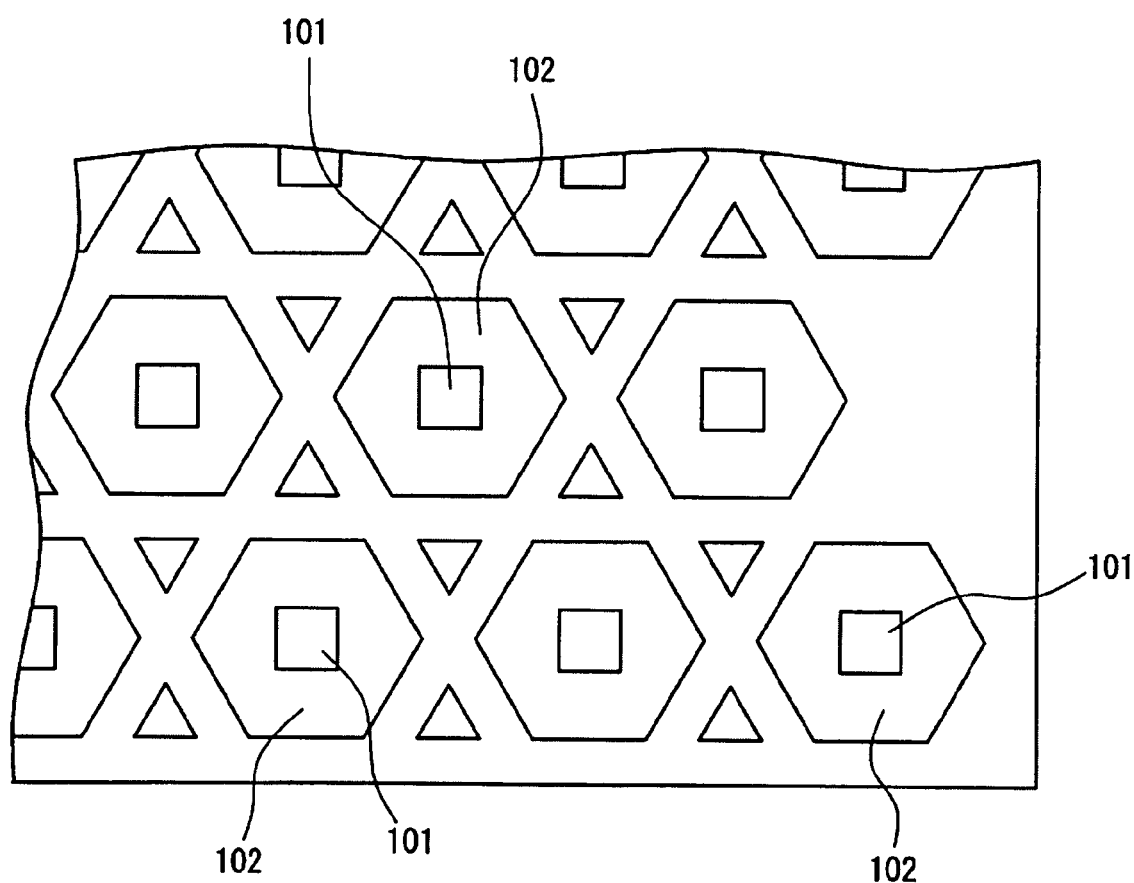
FIG. 4 is a plan view showing a plurality of light emitting elements, each formed on one of a plurality of sub-mounts.
Figure 5:
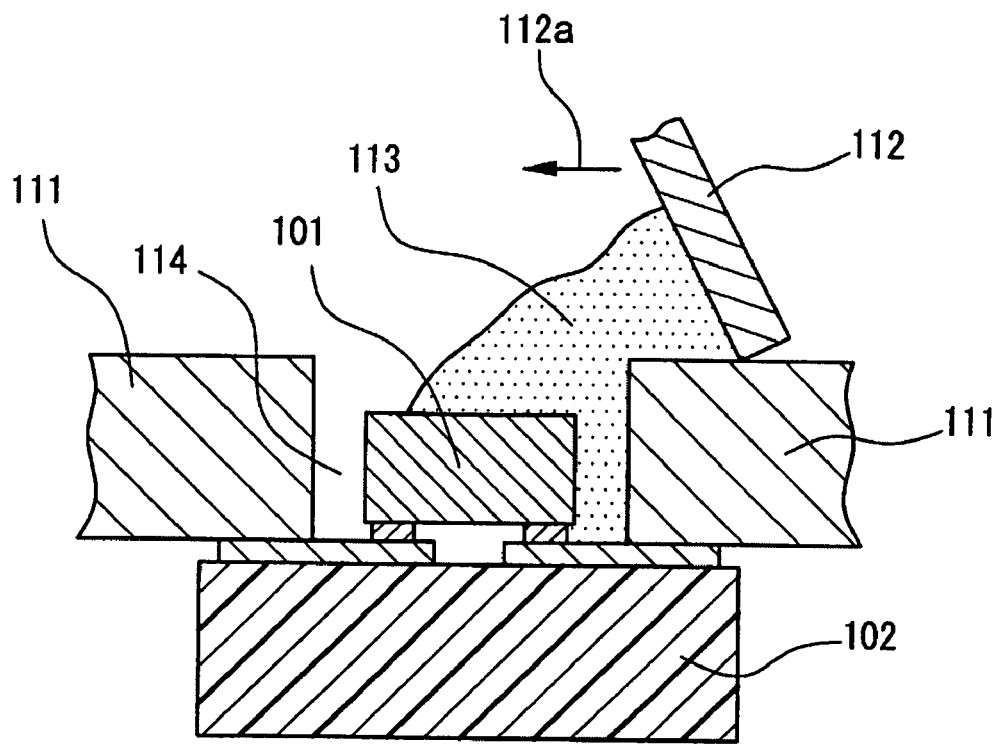
FIG. 5 is an end view of a longitudinal cross-section describing a process for coating a light emitting element on a sub-mount using screen printing.
Figure 6:
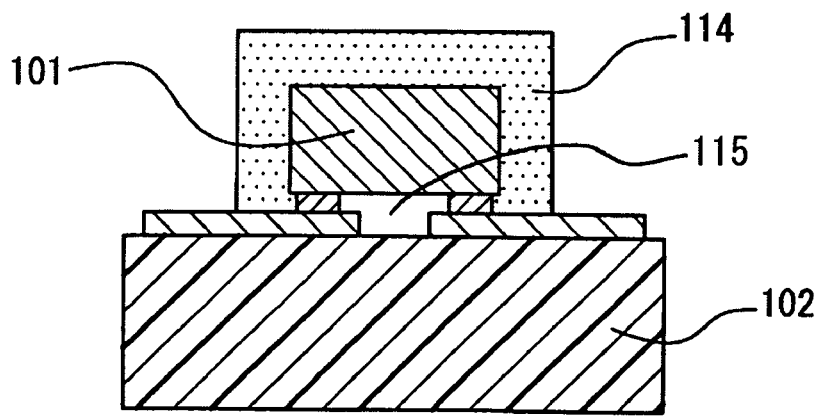
FIG. 6 is a longitudinal sectional view showing a light emitting element on a sub-mount that has been coated with a resin layer.

FIG. 4 is a plan view showing a light emitting element 101 positioned on each of a plurality of hexagonal sub-mounts 102. A resin composition is screen printed onto this plurality of sub-mounts 102 using a masking material with the required openings, thereby coating each of the light emitting elements 101 with a resin layer. In other words, FIG. 5 represents a cross-sectional end view used for describing the screen printing process, wherein a metal mask 111 is positioned in close contact on top of the light emitting element 101 that has been flip-chip mounted on the sub-mount 102, and a resin composition 113 that has been incorporated into a squeegee 112 is then used to fill an opening 114 in the metal mask 111 by moving the squeegee 112 in the direction of an arrow 112a. Subsequently, the metal mask is removed. FIG. 6 is a cross-sectional view showing the light emitting element 101 that has been flip-chip mounted on the sub-mount 102 coated with the resin composition 113. Subsequently, the resin composition 113 is subjected to step curing under predetermined conditions, thereby forming a cured resin layer 114.

In this embodiment, a hollow space 115 is formed between the light emitting element 101 and the sub-mount 102. The space 115 may be filled with the cured resin layer 114. However, if the space 115 is filed with a cured resin, the light-emitting element 101 may be disadvantageously lifted up when the filled cured resin thermally expands. In the case where the space 115 is hollow, the light-emitting element 101 can be advantageously prevented from being lifted. The space 115 can be made hollow by adjusting the viscosity of the resin composition 113.

Each of the light emitting elements 101 that has been coated with the cured resin layer 114 in this manner is then cut from the structure with its corresponding sub-mount 102, and this sub-mount 102 is then secured to the upper surface of the support 103a.

Supports 103b and 103c for supporting the glass lens 104 are bonded to the support 103a with an insulating layer disposed therebetween, and the electrode 106a on the sub-mount 102 is connected electrically via a wire 109a to an electrode 107 formed on the support 103a, whereas the electrode 106b is connected electrically via a wire 109b to an electrode 108 provided on the support 103b.

A hollow portion 105 is filled with nitrogen gas. The gas introduced into this hollow portion may be either air or an inert gas, although in order to prevent corrosion of the metal materials, is preferably an inert gas such as nitrogen, argon or helium.

An aluminum nitride plate with a thickness of approximately 1.5 mm is used for the supports 103a, 103b, and 103c.

However, these supports may also be formed using a different insulating substrate from aluminum nitride, such as silicon carbide or BT resin.

EXAMPLES

Synthesis Examples

The methyltrimethoxysilane used in Synthesis Examples described below is KBM13 (a brand name) manufactured by Shin-Etsu Chemical Co., Ltd., and the dimethyldimethoxysilane is KBM22 (a brand name), also manufactured by Shin-Etsu Chemical Co., Ltd.

Synthesis Example 1

A stirrer and a condenser tube were fitted to a 1 L three-neck flask. This flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the reaction system maintained at 0 to 20° C., 60.5 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 30% by mass, the solution was aged for 12 hours at room temperature, yielding a mixture of an organopolysiloxane 1 (79.1 g) with a weight average molecular weight of 19,000, represented by a formula (4) shown below:

$$(CH_3)_{1.2}(OX)_{0.25}SiO_{1.28} \quad (4)$$

(wherein, X represents a combination of hydrogen atoms, methyl groups, and isobutyl groups), and 33.9 g of a mixed alcohol.

Synthesis Example 2

A stirrer and a condenser tube were fitted to a 1 L three-neck flask. This flask was then charged with 68.1 g (0.5 mols) of methyltrimethoxysilane, 60.1 g (0.5 mols) of dimethyldimethoxysilane, and 118 g of isobutyl alcohol, and the mixture was cooled in ice with constant stirring. With the temperature inside the reaction system maintained at 0 to 20° C., 54 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 30% by mass, the solution was aged for 12 hours at room temperature, yielding a mixture of an organopolysiloxane 2 (76.3 g) with a weight average molecular weight of 9,000, represented by a formula (5) shown below:

$$(CH_3)_{1.5}(OX)_{0.22}SiO_{1.14} \quad (5)$$

(wherein, X represents a combination of hydrogen atoms, methyl groups, and isobutyl groups), and 32.7 g of a mixed alcohol.

Synthesis Example 3

A stirrer and a condenser tube were fitted to a 1 L three-neck flask. This flask was then charged with 115.8 g (0.85 mols) of methyltrimethoxysilane, 18.0 g (0.15 mols) of dimethyldimethoxysilane, and 102 g of isobutyl alcohol, and the mixture was cooled in ice with constant stirring. With the temperature inside the reaction system maintained at 0 to 20° C., 78.3 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 30% by mass, the solution was aged for an extended period (72 hours) at room temperature, yielding a mixture of an organopolysiloxane 3 (68.6 g) with a weight average molecular weight of 98,000, represented by a formula (6) shown below:

$$(CH_3)_{1.15}(OX)_{0.23}SiO_{1.31} \quad (6)$$

(wherein, X represents a combination of hydrogen atoms, methyl groups, and isobutyl groups), and 29.4 g of a mixed alcohol.

Synthesis Example 4

A stirrer and a condenser tube were fitted to a 1 L three-neck flask. This flask was then charged with 27.2 g (0.2 mols) of methyltrimethoxysilane, 96.2 g (0.8 mols) of dimethyldimethoxysilane, and 106 g of isobutyl alcohol, and the mixture was cooled in ice with constant stirring. With the temperature inside the reaction system maintained at 0 to 20° C., 57.1 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and the volatile fraction was adjusted to 30% by mass, yielding a mixture of an organopolysiloxane C1 (69.3 g) with a weight average molecular weight of 16,000, represented by a formula (7) shown below:

$$(CH_3)_{1.8}(OX)_{0.22}SiO_{0.99} \quad (7)$$

(wherein, X represents a combination of hydrogen atoms, methyl groups, and isobutyl groups), and 29.7 g of a mixed alcohol.

Synthesis Example 5

A stirrer and a condenser tube were fitted to a 1 L three-neck flask. This flask was then charged with 136.2 g (1.0 mols) of methyltrimethoxysilane and 106 g of isobutyl alcohol, and the mixture was cooled in ice with constant stirring. With the temperature inside the reaction system maintained at 0 to 20° C., 81 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and following adjustment of the volatile fraction to 30% by mass, the solution was aged for 12 hours at room temperature, yielding a mixture of an organopolysiloxane C2 (73.5 g) with a weight average molecular weight of 23,000, represented by a formula (8) shown below:

$$(CH_3)_{1.0}(OX)_{0.24}SiO_{1.38} \qquad (8)$$

(wherein, X represents a combination of hydrogen atoms, methyl groups, and isobutyl groups), and 31.5 g of a mixed alcohol.

Synthesis Example 6

A stirrer and a condenser tube were fitted to a 1 L three-neck flask. This flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the reaction system maintained at 0 to 20° C., 60.5 g of a 0.05 N hydrochloric acid solution was added dropwise. Following completion of the dropwise addition, the reaction mixture was stirred for 24 hours at room temperature. Subsequently, 150 g of xylene was added to dilute the reaction solution thus obtained. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and the volatile fraction was adjusted to 30% by mass, yielding a mixture of an organopolysiloxane C3 (67.2 g) with a weight average molecular weight of 3,100, represented by a formula (9) shown below:

$$(CH_3)_{1.2}(OX)_{1.21}SiO_{0.79} \qquad (9)$$

(wherein, X represents a combination of hydrogen atoms, methyl groups, and isobutyl groups), and 28.8 g of a mixed alcohol.

Synthesis Example 7

A stirrer and a condenser tube were fitted to a 1 L three-neck flask. This flask was then charged with 40.9 g (0.3 mols) of methyltrimethoxysilane, 170.8 g (0.7 mols) of diphenyldimethoxysilane, and 106 g of isobutyl alcohol, and the mixture was cooled in ice with constant stirring. With the temperature inside the reaction system maintained at 0 to 20° C., 55.1 g of a 0.05 N hydrochloric acid solution was added dropwise. Following completion of the dropwise addition, the reaction mixture was stirred for 7 hours under reflux at 80° C. Subsequently, the reaction solution was cooled to room temperature, and 150 g of xylene was added to dilute the reaction solution. The reaction solution was then poured into a separating funnel, and washed repeatedly with 300 g samples of water until the electrical conductivity of the separated wash water fell to no more than 2.0 μS/cm. The water was then removed from the washed reaction solution by azeotropic distillation, and the volatile fraction was adjusted to 30% by mass, yielding a mixture of an organopolysiloxane C4 (71.4 g) with a weight average molecular weight of 15,400, represented by a formula (10) shown below:

$$(CH_3)_{0.3}(C_6H_5)_{1.4}(OX)_{0.16}SiO_{1.07} \qquad (10)$$

(wherein, X represents a combination of hydrogen atoms, methyl groups, and isobutyl groups), and 30.6 g of a mixed alcohol.

EXAMPLES

Examples 1 to 11, Comparative Examples 1 to 8

Compositions were prepared by blending the organopolysiloxanes 1 to 3, and C1 to C4 obtained in Synthesis Examples 1 to 7 with condensation catalysts, solvents (including the aforementioned mixed alcohols), and finely powdered inorganic fillers in the proportions shown in Table 1. The screen printing characteristics of these compositions, and the characteristics (crack resistance, adhesion, ultraviolet light resistance, and heat resistance) of the cured products (cured films) obtained by curing the compositions were tested and evaluated in accordance with the methods described below.

<Evaluation Methods>

-1. Screen Printing Characteristics-

Each of the obtained compositions was applied with a squeegee using stainless steel molding test patterns (10 mm×10 mm×0.2 mm, 5 mm×5 mm×0.2 mm, and 2 mm×2 mm×0.2 mm), and was then subjected to a step curing at 80° C. for one hour, 150° C. for one hour, and then 200° C. for one hour, yielding cured films (of substantially square shape) with a dried film thickness of 0.15 mm. The external appearance of these cured films was evaluated visually. If no abnormalities were observed at the corner portions of the square-shaped cured films (that is, no rounding), then the screen printing characteristics were evaluated as "good", and were recorded as A, if slight rounding was observed at the corner portions of the square-shaped cured films, the screen printing characteristics were evaluated as "fair", and were recorded as B, and if the corner portions of the square-shaped cured films were significantly rounded, the screen printing characteristics were evaluated as "poor", and were recorded as C.

-2. Crack Resistance-

Each of the obtained compositions was placed in a Teflon (registered trademark) coated mold (50 mm×50 mm×2 mm), subsequently subjected to step curing at 80° C. for one hour, 150° C. for one hour, and 200° C. for one hour, and then post-cured for 8 hours at 200° C., thus yielding a cured film with a dried film thickness of 1 mm. The cured film was inspected visually for the presence of cracks. If no cracks were visible in the cured film, the crack resistance was evaluated as "good", and was recorded as A, whereas if cracks were detected, the resistance was evaluated as "poor", and was recorded as B. Furthermore, if a cured film was not able to be prepared, a "measurement impossible" evaluation was recorded as C.

-3. Adhesion-

Each of the obtained compositions was applied to a glass substrate using an immersion method, subsequently subjected to step curing at 80° C. for one hour, 150° C. for one hour, and 200° C. for one hour, and then post-cured for 8 hours at 200° C., thus forming a cured film with a dried thickness of 2 to 3 μm on top of the glass substrate. Using a cross-cut adhesion test, the adhesion of the cured film to the glass substrate was investigated. In the cross-cut adhesion test, the cured film formed on top of the glass substrate was cut with a sharp blade right through to the substrate so as to form sections of a fixed size (1 mm×1 mm), an adhesive tape was affixed to the surface of the cut sections and pressed down firmly, and a corner of the adhesive tape was then grasped and pulled rapidly away from the substrate in a vertical direction. The number of individual sections amongst the total number of sections (100) that were not peeled off the substrate are shown in the tables. Furthermore, in those cases where cracks had developed in the cured product, making adhesion measurement impossible, the result was recorded in the table as x.

-4. Ultraviolet Light Resistance

Each of the obtained compositions was placed in a Teflon (registered trademark) coated mold (40 mm×20 mm×0.4 mm), subsequently subjected to step curing at 80° C. for one hour, 150° C. for one hour, and 200° C. for one hour, and then post-cured for 8 hours at 200° C., thus yielding a cured film with a dried film thickness of 0.2 mm. This cured film was then irradiated with UV radiation (30 mW) for 24 hours using a UV irradiation device (brand name: Eye Ultraviolet Curing Apparatus, manufactured by Eyegraphics Co., Ltd.). The surface of the cured film following UV irradiation was then inspected visually. If absolutely no deterioration of the cured film surface was noticeable, the ultraviolet light resistance was evaluated as "good", and was recorded as A, if slight deterioration was noticeable, the ultraviolet light resistance was evaluated as "fair", and was recorded as B, and if significant deterioration was noticeable, the ultraviolet light resistance was evaluated as "poor", and was recorded as C. Furthermore, if a cured film was not able to be prepared, a "measurement impossible" evaluation was recorded as x.

-5. Heat Resistance

Each of the obtained compositions was placed in a Teflon (registered trademark) coated mold (50 mm×50 mm×2 mm), subsequently subjected to step curing at 80° C. for one hour, 150° C. for one hour, and 200° C. for one hour, and then post-cured for 8 hours at 200° C., thus yielding a cured film with a dried film thickness of 1 mm. This cured film was then placed in an oven at 250° C., and the remaining mass was measured after 500 hours in the oven. Using this measured value, the residual mass reduction ratio (%) was determined using the following formula, and this ratio was used as an indicator of the heat resistance.

Residual mass reduction ratio=(mass of cured film following 500 hours in oven)/(mass of cured film immediately following preparation)×100

Furthermore, if a cured film was not able to be prepared, a "measurement impossible" evaluation was recorded as x. In the tables, the heat resistance is shown as a percentage (%)

<Results>

The results obtained for the aforementioned Examples and Comparative Examples are shown below in Tables 1 to 3.

In the tables, Aerosil 300 used as the component (iv) is a fumed silica with a BET specific surface area of 300 m$^2$/g (manufactured by Nippon Aerosil Co., Ltd.), and Cabosil MS-7 is a fumed silica with a BET specific surface area of 200 m$^2$/g (manufactured by Cabot Corporation, U.S.A.). Furthermore, the organopolysiloxane C5 is a polymer with a non-volatile fraction of substantially 100% obtained by stripping the mixture of the organopolysiloxane 1 and the mixed alcohol obtained in Synthesis Example 1 to remove the solvents. Furthermore, the methyl group content value represents the theoretical quantity of methyl groups within the organopolysiloxane. The units for the blend quantities of each of the components are parts by mass.

TABLE 1

| | | Examples | | | | | |
|---|---|---|---|---|---|---|---|
| | | 1 | 2 | 3 | 4 | 5 | 6 |
| (i) | Organopolysiloxane 1 | 5 | — | — | 5 | 5 | 5 |
| | Organopolysiloxane 2 | — | 5 | — | — | — | — |
| | Organopolysiloxane 3 | — | — | 5 | — | — | — |
| (ii) | Zinc octylate | 0.02 | 0.02 | 0.02 | — | — | 0.02 |
| | Aluminum butoxy-bis(ethylacetoacetate) | — | — | — | 0.02 | — | — |
| | tetrabutyl titanate | — | — | — | — | 0.02 | — |
| (iii) | Diglyme | 1.0 | 1.0 | 1.0 | 1.0 | 1.0 | 0.7 |
| | Triglyme | — | — | — | — | — | 0.3 |
| | Mixed alcohol | 2.2 | 2.2 | 2.2 | 2.2 | 2.2 | 2.2 |
| (iv) | Aerosil 300 | 1.0 | 1.0 | 1.0 | 1.0 | 1.0 | 1.0 |
| Methyl group content (% by mass) | | 26.0 | 31.5 | 25.1 | 26.0 | 26.0 | 26.0 |
| Weight average molecular weight | | 19,000 | 9,000 | 98,000 | 19,000 | 19,000 | 19,000 |
| Screen printing characteristics | | A | A | A | A | A | A |
| Crack resistance | | A | A | A | A | A | A |
| Adhesion | | 100/100 | 100/100 | 100/100 | 100/100 | 100/100 | 100/100 |
| Ultraviolet light resistance | | A | A | A | A | A | A |
| Heat resistance (%) | | 98 | 95 | 99 | 98 | 97 | 98 |

TABLE 2

|   |   | Examples | | | | |
|---|---|---|---|---|---|---|
|   |   | 7 | 8 | 9 | 10 | 11 |
| (i) | Organopolysiloxane 1 | 5 | 5 | 5 | 5 | 5 |
| (ii) | Zinc octylate | 0.02 | 0.02 | 0.02 | 0.02 | 0.02 |
| (iii) | Triglyme | 0.3 | — | — | — | — |
|   | Methylcarbitol | 0.7 | 1.0 | 1.0 | 1.0 | 1.0 |
|   | Mixed alcohol | 2.2 | 2.2 | 2.2 | 2.2 | 2.2 |
| (iv) | Aerosil 300 | 1.0 | 1.0 | 0.3 | 2.0 | — |
|   | Cabosil MS-7 | — | — | — | — | 1.0 |
| Methyl group content (% by mass) | | 26.0 | 26.0 | 26.0 | 26.0 | 26.0 |
| Weight average molecular weight | | 19,000 | 19,000 | 19,000 | 19,000 | 19,000 |
| Screen printing characteristics | | A | A | B | A | A |
| Crack resistance | | A | A | A | A | A |
| Adhesion | | 100/100 | 100/100 | 100/100 | 100/100 | 100/100 |
| Ultraviolet light resistance | | A | A | A | A | A |
| Heat resistance (%) | | 98 | 98 | 98 | 98 | 98 |

TABLE 3

|   |   | Comparative Examples | | | | | | | |
|---|---|---|---|---|---|---|---|---|---|
|   |   | 1 | 2 | 3 | 4 | 5 | 6 | 7 | 8 |
| (i) | Organopolysiloxane 1 | — | — | — | — | — | 5 | — | 5 |
| (other) | Organopolysiloxane C1 | 5 | — | — | — | — | — | — | — |
|   | Organopolysiloxane C2 | — | 5 | — | — | — | — | — | — |
|   | Organopolysiloxane C3 | — | — | 5 | — | — | — | — | — |
|   | Organopolysiloxane C4 | — | — | — | 5 | — | — | — | — |
|   | Organopolysiloxane C5 | — | — | — | — | 5 | — | 5 | — |
| (ii) | Zinc octylate | 0.02 | 0.02 | 0.02 | 0.02 | 0.02 | — | 0.02 | 0.02 |
| (iii) | Diglyme | 1 | 1 | 1 | 1 | — | — | — | 1 |
|   | Mixed alcohol | 2.2 | 2.2 | 2.2 | 2.2 | — | 2.2 | — | 2.2 |
| (iv) | Aerosil 300 | 1 | 1 | 1 | 1 | — | — | 1 | — |
| Methyl group content (% by mass) | | 40.5 | 22.4 | 26.0 | 26.0 | 26 | 26 | 26 | 26 |
| Weight average molecular weight | | 16,000 | 23,000 | 3,100 | 15,400 | 19,000 | 19,000 | 19,000 | 19,000 |
| Screen printing characteristics | | A | A | A | A | C | C | C | C |
| Crack resistance | | A | B | B | A | A | C | A | A |
| Adhesion | | 50/100 | x | x | 60/100 | 70/100 | x | 60/100 | 70/100 |
| Ultraviolet light resistance | | B | A | A | C | A | x | A | A |
| Heat resistance (%) | | 84 | x | x | 91 | 98 | x | 98 | 99 |

Examples 12 to 15

In each of the following Examples, a light emitting device of the type shown in FIG. 1 was produced. A LED chip of the type described below was used as the light emitting element 101.

(1) Production of LED Chip

The LED chip that was used was produced by laminating a GaN layer of an undoped nitride semiconductor, a Si-doped n-type GaN layer that represents an n-type contact layer with an n-type electrode formed thereon, and a GaN layer of an undoped nitride semiconductor on top of a sapphire substrate that functions as the translucent substrate, and subsequently forming an active layer by laminating 5 sets on top of the laminate, wherein each set comprises a GaN layer as a barrier layer and an InGaN layer as a well layer, and then finally laminating a GaN layer as a barrier layer on top of the 5 sets of layers. The active layer has a multi-quantum well structure. The active layer was formed by flowing TMG (trimethyl gallium) gas, TMI (trimethyl indium) gas, nitrogen gas, and a dopant gas, together with a carrier gas onto the surface of a cleaned sapphire substrate, and using a MOCVD method to form a film of the nitride semiconductor. By switching the dopant gas from $SiH_4$ to $Cp_2Mg$, n-type semiconductor layers and p-type semiconductor layers were formed. In addition, an AlGaN layer as a Mg-doped p-type cladding layer, and a p-type GaN layer that represents a Mg-doped p-type contact layer were laminated sequentially on top of the active layer. The GaN layer was formed on the surface of the sapphire substrate at low temperature and functions as a buffer layer.

Furthermore, the p-type semiconductor was annealed at a temperature of at least 400° C. following film formation. An LED chip prepared in this manner is a nitride semiconductor element with an active layer containing an $In_{0.2}Ga_{0.8}N$ semiconductor with a monochromatic emission peak of visible light at a wavelength of 455 nm.

Etching is used to expose the surfaces of the p-type contact layer and the n-type contact layer on the same surface of the nitride semiconductor on the sapphire substrate. Sputtering using ITO (a compound oxide of indium and tin) as the sputtering material is then conducted on top of the p-type contact layer, thereby providing a striped diffusion electrode across substantially the entire surface of the p-type contact layer. By using this type of electrode, the current flowing through the diffusion electrode is spread out across a wide area of the p-type contact layer, enabling the light emission efficiency of the LED chip to be improved.

In addition, sputtering using Rh/Pt/Au and W/Pt/Au is conducted sequentially on the p-side diffusion electrode and a portion of the n-type contact layer respectively, thereby forming metal layers that function as the p-side seat electrode and the n-side seat electrode. Finally, the wafer comprising the laminated semiconductors and formed electrodes is converted to chips by a dicing process, forming LED chips of dimensions 1 mm×1 mm. In these Examples, the n-type seat electrode, which is formed on the n-type semiconductor that is exposed in a striped pattern, is exposed through the insulating protective film ($SiO_2$) at two opposing edges on top of the LED chip. Furthermore, when viewed from above the LED chip, the n-type semiconductor exposed by the etching process has narrow constricted portions that extend from the corner portions where the n-type seat electrode is exposed towards the center of the LED chip. Furthermore, the n-type semiconductor also has an elongated portion that links this opposing pair of constricted portions. Moreover, the p-side semiconductor layer and diffusion electrode are positioned so as to sandwich this elongated portion, or alternatively, the p-side seat electrode is exposed through the protective layer.

(2) Mounting to Sub-Mount

As shown in FIG. 1, FIG. 2, and FIG. 3, the LED chip 101 is positioned so that the p-side and n-side seat electrodes of the LED chip oppose the conductor electrodes 106a and 106b respectively of the sub-mount 102 via Au bumps, and the application of load, ultrasound, and heat is then used to weld the bumps to the electrodes 106a and 106b, thereby connecting the LED chip to the sub-mount 102.

(3) Preparation of the Phosphor

A coprecipitated oxide, obtained by using oxalic acid to coprecipitate a solution comprising the rare earth elements Y, Gd, and Ce dissolved in a stoichiometric ratio within an acid, and then firing the thus formed coprecipitate, is mixed with aluminum oxide, yielding a raw material mixture. A suitable quantity of barium fluoride is then mixed into the raw material as a flux, and the mixture is placed in a crucible and fired in air at a temperature of 1400° C. for a period of 3 hours to form a calcined product. This calcined product is subsequently ball-milled in water, and then washed, separated, dried and finally passed through a sieve to complete the formation of a $(Y_{0.995}Gd_{0.005})_{2.750}Al_5O_{12}:Ce_{0.250}$ phosphor (a so-called YAG phosphor) with a central particle diameter of 8 μm.

(4) Base Composition for Screen Printing

The compositions A and B described below were prepared as base compositions for screen printing.

<Composition A>

The same composition as that according to the aforementioned Example 1, with the exception of not adding the zinc octylate (the condensation catalyst) of the component (ii).

<Composition B>

The composition obtained by adding an alkoxysilane-based coupling agent to the composition A.

Example 12

Using an aforementioned LED mounted to a sub-mount, a white light emitting device was prepared using the procedure described below.

5 g of the base composition A and 5 g of the aforementioned YAG phosphor were weighed into a predetermined container, and were then mixed by stirring for three minutes and then defoamed for one minute. 0.5 g of zinc octylate was then added as a catalyst, and the mixture was once again stirred for three minutes and then defoamed for one minute. This process yielded a phosphor-containing silicone resin paste. The paste had a viscosity (23° C.) of 70 Pa·s.

The paste was then applied by screen printing, using a commercially available screen printing device, to a plurality of LEDs that had each been flip-chip mounted to a corresponding sub-mount, as shown in FIG. 4. In other words, a metal mask with a predetermined pattern of openings was positioned in close contact on top of the LEDs, and the paste was applied using the method described above in FIG. 5, thereby forming a coating over each LED as shown in FIG. 6. The resulting molded product was then subjected to low-temperature curing by heating for one hour at 80° C., and was then subjected to heat curing, firstly for one hour at 150° C., and then for a further 8 hours at 200° C. In this manner, a phosphor-containing silicone resin layer 114 of thickness 60 μm was formed around the periphery of the light emitting element 101, completing preparation of a white light emitting element.

Subsequently, each LED was cut from the structure with its corresponding sub-mount 102, and the sub-mount 102 was secured to a support 103a. The electrodes 106a and 106b on the sub-mount 102 were then connected electrically via wires to the electrode 107 provided on the support 103a and the electrode 108 provided on the support 103b respectively.

Meanwhile, an epoxy resin (manufactured by Shin-Etsu Chemical Co., Ltd.) was printed onto the edges of the glass lens 104 where the glass lens 104 makes contact with the supports 103b and 103c, and this resin was then heat treated for one hour at 100° C. to form a B-stage resin.

Subsequently, the glass lens 104 was used to cover the package on which the white light emitting element (the resin layer-coated light emitting element) had been mounted, and the resulting structure was subjected to heat curing at 150° C. for 10 minutes, thereby sealing the element in an airtight manner. This completed the production of a white light emitting device.

Example 13

With the exception of using the base composition B instead of the base composition A, a white light emitting device was prepared in the same manner as Example 12.

Example 14

With the exception that the YAG phosphor was not added, a silicone resin paste was prepared and a light-emitting device was produced in the same manner as Example 12.

Example 15

With the exception that the YAG phosphor was not added, a silicone resin paste was prepared and a light-emitting device was produced in the same manner as Example 13.

-Evaluation of Characteristics-

Samples of the white light emitting devices produced in Examples 12 and 13 were lit continually under the three sets of operating conditions listed below, and after 1000 hours, the output retention ratio and the level of color tone retention ratio relative to the initial values were measured and evaluated based on the judgment criteria described below. The results are shown in Table 4. A high level of reliability was observed.

-Operating Conditions (1) A current of 700 mA was passed through the device in a thermostatic chamber set to a temperature of 85° C. and a humidity of 85%.

(2) A current of 700 mA was passed through the device in a thermostatic chamber set to a temperature of 60° C. and a humidity of 90%.

(3) A current of 700 mA was passed through the device in a thermostatic chamber set to a temperature of 25° C. and a humidity of 50%.

-Judgment Criteria
Output retention ratio: Output values that were 70% or greater of the initial value were evaluated as "good".
Color tone retention ratio: Devices for which both Δx and Δy were within ±0.005 of the initial values were evaluated as "good".

TABLE 4

|  | (1) 85° C., 85% | (2) 60° C., 90% | (3) 25° C., 50% | Overall evaluation |
|---|---|---|---|---|
| Example 12 | good | good | good | good |
| Example 13 | good | good | good | good |

What is claimed is:

1. A light emitting device, comprising a light emitting element, and a resin layer that has been screen printed to coat said light emitting element, wherein
said resin layer comprises a cured product in a dry state formed by curing a curable silicone resin composition, said curable silicone resin composition comprising:
(i) an organopolysiloxane with a polystyrene equivalent weight average molecular weight of at least $5 \times 10^3$, represented by an average composition formula (1) shown below:

$$R^1_a(OX)_bSiO_{(4-a-b)/2} \tag{1}$$

wherein, each $R^1$ represents, independently, an alkyl group, alkenyl group or aryl group of 1 to 6 carbon atoms, each X represents, independently, a hydrogen atom, or an alkyl group, alkenyl group, alkoxyalkyl group or acyl group of 1 to 6 carbon atoms, a represents a number within a range from 1.05 to 1.5, b represents a number that satisfies 0<b<2, and a value of a+b satisfies 1.05<a+b<2,
(ii) a condensation catalyst selected from the group consisting of organometallic compounds containing a zinc, aluminium, titanium, tin, or cobalt atom,
(iii) a solvent, and
(iv) a finely powdered inorganic filler.

2. The light emitting device according to claim 1, wherein said $R^1$ represents a methyl group.

3. The light emitting device according to claim 1, wherein a proportion of said $R^1$ groups within said organopolysiloxane (i) is no more than 32% by mass.

4. The light emitting device according to claim 1, wherein said condensation catalyst (ii) is an organometallic catalyst.

5. The light emitting device according to claim 1, wherein said resin layer has a thickness within a range from 10 μm to 3 mm, and is colorless and transparent.

6. The light emitting device according to claim 1, wherein said light emitting element is flip-chip mounted to a sub-mount substrate, and said light emitting element and said sub-mount substrate are coated with a screen printed resin layer.

7. The light emitting device according to claim 6, wherein a hollow space is formed between said light emitting element and said sub-mount substrate.

* * * * *